United States Patent [19]

Sato et al.

[11] 4,246,601
[45] Jan. 20, 1981

[54] SOLID-STATE COLOR IMAGING DEVICE

[75] Inventors: Kazuhiro Sato, Tokyo; Shusaku Nagahara, Hachioji; Masuo Umemoto, Hinodemachi; Toshiyuki Akiyama, Kokubunji; Morishi Izumita, Inagi; Kenji Takahashi, Kodaira; Seiichi Mita, Hachioji, all of Japan

[73] Assignee: Hitachi, Ltd., Japan

[21] Appl. No.: 10,886

[22] Filed: Feb. 9, 1979

[30] Foreign Application Priority Data

Feb. 10, 1978 [JP] Japan .......................... 53-15031[U]

[51] Int. Cl.³ .................... H04N 9/04; H04N 9/07
[52] U.S. Cl. .......................................... 358/47; 358/44
[58] Field of Search .................. 358/41, 43, 44, 47

[56] References Cited

U.S. PATENT DOCUMENTS

| 3,982,274 | 9/1976 | Chai | 358/41 |
|---|---|---|---|
| 4,042,956 | 8/1977 | Yamanaka | 358/41 |
| 4,054,906 | 10/1977 | Yamanaka | 358/44 |
| 4,054,915 | 10/1977 | Sugihara | 358/41 |
| 4,087,836 | 5/1978 | DeFoe | 358/44 |
| 4,117,510 | 9/1978 | Ohta | 358/44 |
| 4,121,244 | 10/1978 | Nakabe | 358/44 |

Primary Examiner—John C. Martin
Assistant Examiner—Michael Allen Masinick
Attorney, Agent, or Firm—Craig & Antonelli

[57] ABSTRACT

A solid-state color imaging device is provided including a plurality of photosensors which are arrayed in horizontal and vertical directions, and a mosaic color filter made up of filter elements arranged in correspondence with the respective photosensors. The mosaic color filter is arranged such that any group of four adjacent filter elements comprises a first filter which is made for panchromatic transmission, a second filter which is selected from among a first spectral region-transmitting filter, a second spectral region-transmitting filter and a third spectral region-transmitting filter respectively exhibiting different transmission characteristics, and third and fourth filters which are made of complementary color filters which transmit the transmission light component of the second filter and which have transmission components different from each other. The solid-state color imaging device also has means for simultaneously reading out optical signals of two of the photosensors adjacent in the vertical direction, and means for adding the two output signals.

16 Claims, 37 Drawing Figures

U.S. Patent  Jan. 20, 1981  4,246,601
PRIOR ART
FIG. 1
PRIOR ART
FIG. 2
FIG. 3
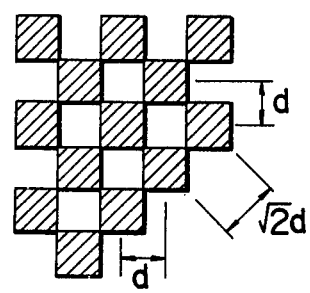
FIG. 4(a)
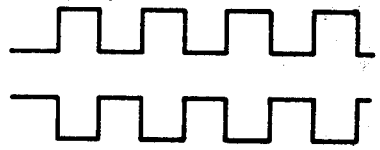
FIG. 4(b)
FIG. 5
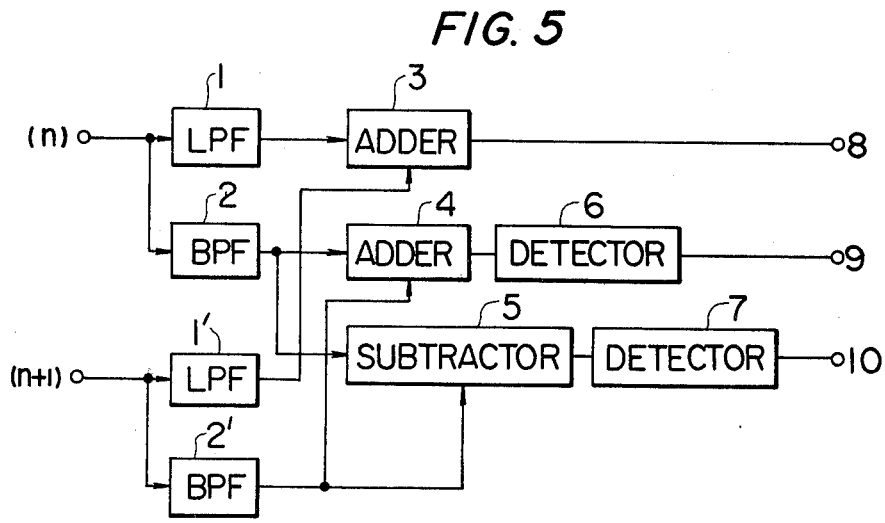

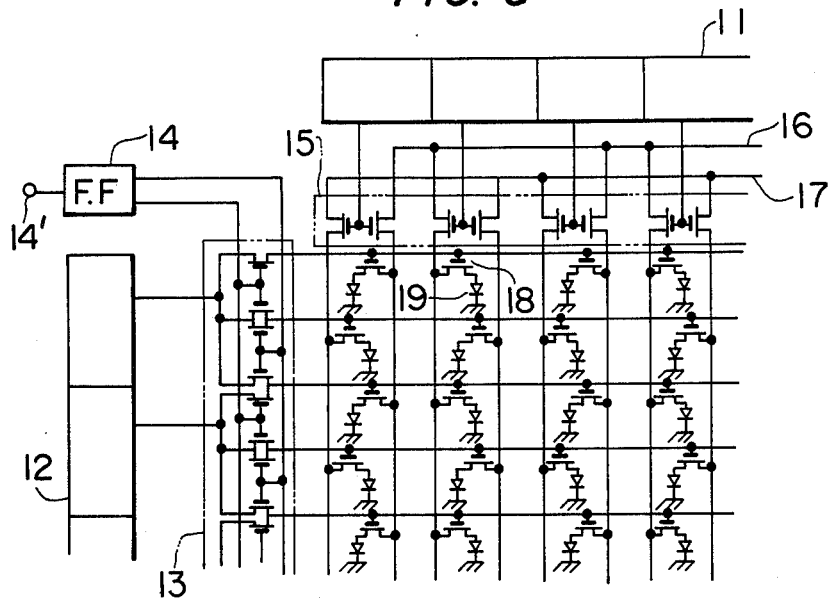

FIG. 9
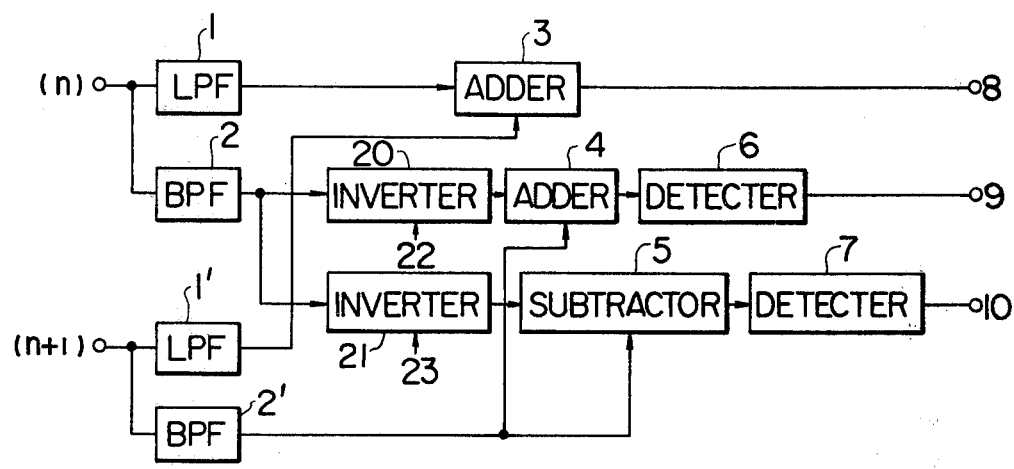
FIG. 10(a)   FIG. 10(b)
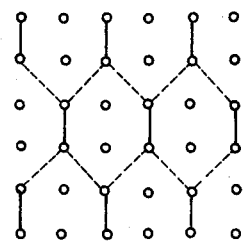   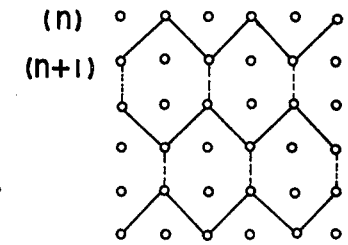
FIG. 11(a)   FIG. 11(b)
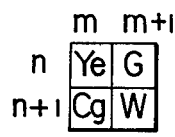   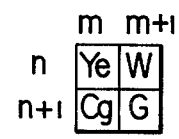

FIG. 13(a)
|     | m  | m+1 |
|-----|----|-----|
| n   | Ye | R   |
| n+1 | Mg | W   |
FIG. 13(b)
|     | m  | m+1 |
|-----|----|-----|
| n   | Mg | W   |
| n+1 | Cy | B   |
FIG. 13(c)
|     | m  | m+1 |
|-----|----|-----|
| n   | Ye | W   |
| n+1 | Mg | R   |
FIG. 13(d)
|     | m  | m+1 |
|-----|----|-----|
| n   | Mg | B   |
| n+1 | Cy | W   |
FIG. 16
|     | m  | m+1 | m+2 | m+3 |    |    |    |
|-----|----|-----|-----|-----|----|----|----|
| n   | Ye | W   | Cy  | G   | Ye | W  | Cy |
| n+1 | Cy | Ye  | Ye  | W   | Cy | G  | Ye |
|     | Ye | W   | Cy  | G   | Ye | W  | Cy |
|     | Cy | G   | Ye  | W   | Cy | G  | Ye |
|     | Ye | W   | Cy  | G   | Ye | W  | Cy |
|     | Cy | G   | Ye  | W   | Cy | G  | Ye |
FIG. 17(a)
FIG. 17(b)
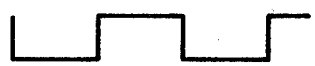
FIG. 17(c)
FIG. 17(d)
FIG. 19(a)
| Cy | W | Ye | G |
|----|---|----|---|
| Ye | G | Cy | W |
FIG. 19(b)
| Cy | W | Mg | B |
|----|---|----|---|
| Mg | B | Cy | W |
FIG. 19(c)
| Mg | W | Cy | B |
|----|---|----|---|
| Cy | B | Mg | W |
FIG. 19(d)
| Ye | W | Mg | R |
|----|---|----|---|
| Mg | R | Ye | W |
FIG. 19(e)
| Mg | W | Ye | R |
|----|---|----|---|
| Ye | R | Mg | W |

SOLID-STATE COLOR IMAGING DEVICE

BACKGROUND OF THE INVENTION

1. Field of the Invention

This invention relates generally to solid-state color imaging devices, and more particularly to a solid-state color imaging device in which a plurality of photosensors having different spectral sensitivity characteristics are periodically arrayed in the vertical and horizontal directions.

2. Description of the Prior Art

In recent years, solid-state imaging devices employing CCDs (charge coupled devices) and MOSTs (metal-oxide-semiconductor transistors) have been vigorously developed. For example, a solid-state imaging device of the CCD type is disclosed in U.S. Pat. No. 3,801,884, and a solid-state imaging device of the MOST type is disclosed in "A Low-Light-Level Self-Scanned MOS Image Sensor" by J. D. Plummer et al, 1972, IEEE, International Solid-State Circuits Conference. It has also been attempted to put these solid-state imaging devices into color devices, such as discussed in U.S. Pat. No. 3,971,065.

The solid-state color imaging devices hitherto proposed, however, have various disadvantages such as that the utilization factor of light is inferior, that the resolution is low, that moire patterns appear, and that signal processing circuits for use with the imaging devices are complicated.

SUMMARY OF THE INVENTION

Therefore, it is an object of the present invention to provide a solid-state color imaging device which has a high utilization factor of light and a high resolution.

In order to accomplish this and other objects, according to this invention, a solid-state color imaging device has a plurality of photosensors arrayed in the horizontal and vertical directions. Filter elements of a mosaic color filter which are arranged in correspondence with the individual photosensors are so constructed that a group of four adjacent filter elements (in two rows and two columns) comprises a first filter which is made of a panchromatic transmission filter, a second filter which is selected from among a first spectral region-transmitting filter, second and third spectral region-transmitting filters respectively exhibiting different transmission characteristics, and third and fourth filters which are made of complementary color filters adapted to transmit the transmission light component of the second filter and having transmission components different from each other.

Preferably, the aforecited first region transmissive filter, second region transmissive filter and third region transmissive filter are, respectively, a red transmissive filter (R filter), green transmissive filter (G filter) and blue transmissive filter (B filter), while the complementary color filters are, respectively, a cyan transmissive filter (Cy filter), a magenta transmissive filter (Mg filter) and a yellow transmissive filter (Ye filter). The panchromatic transmission filter (W filter) shall include a state in which substantially no filter is arranged.

One important feature of this invention consists in that, in any group of four adjoining filter elements of a mosaic color filter, they are constructed of different sorts of filters, one of which is a W filter, another of which is one of an R filter, G filter and B filter, and the remaining two of which are complementary color filters different from each other and adapted to transmit the transmission light component of the filter selected from among the R, G and B filters. Thus, with any four adjoining photosensors, the mosaic color filter over the whole area of the solid-state imaging device can transmit one color component of the red component, the green component or the blue component in common without fail. Therefore, the utilization factor of light can be sharply enhanced. Further, a (2R+G+B) signal, a (R+2G+B) signal or a (R+G+2B) signal can be obtained at all times by adding the outputs of any two adjacent horizontal lines. Especially in a case where one of any four adjoining filters is the W filter, another is the G filter and the remaining two are the Cy filter and the Ye filter, all four of the photosensors receive the green component, so that the resolution in an oblique direction is sharply enhanced.

BRIEF DESCRIPTION OF THE DRAWINGS

FIG. 1 is a diagram showing an example of a mosaic color filter which is employed in a prior-art solid-state color imaging device.

FIG. 2 is a diagram for explaining the characteristic of the mosaic color filter shown in FIG. 1.

FIG. 3 is a diagram showing an embodiment of a mosaic color filter in a solid-state color imaging device according to the present invention.

FIGS. 4(a) and 4(b) are diagrams for explaining signals which are provided from the solid-state imaging device employing the mosaic color filter of FIG. 3.

FIG. 5 is a block diagram showing an embodiment of a signal processing circuit for the solid-state imaging device employing the mosaic color filter of FIG. 3.

FIG. 6 is a partial schematic and partial block diagram showing an example of a solid-state imaging device in accordance with the present invention.

FIGS. 7(a) to 7(e) are diagrams each showing a modified embodiment of a mosaic color filter in the solid-state color imaging device of this invention.

FIG. 8 is a diagram showing another embodiment of a mosaic color filter in a solid-state color imaging device of this invention.

FIG. 9 is a block diagram showing an embodiment of a signal processing circuit for the solid-state color imaging device employing the mosaic color filter of FIG. 8.

FIGS. 10(a) and 10(b) are diagrams for explaining an effect of the solid-state color imaging device employing the mosaic color filter of FIG. 8.

FIGS. 11(a) and 11(b) and FIGS. 13(a) to 13(d) are diagrams each showing other embodiments of a mosaic color filter in a solid-state color imaging device of this invention.

FIG. 16 is a diagram showing another embodiment of a mosaic color filter in a solid-state color imaging device of this invention.

FIGS. 17(a) to 17(d) are diagrams for explaining signals which are provided from the solid-state color imaging device employing the mosaic color filter of FIG. 16.

FIGS. 19(a) to 19(e) are diagrams each showing a modified embodiment of the mosaic color filter of the solid-state color imaging device of this invention.

DESCRIPTION OF THE PREFERRED EMBODIMENTS

Figure 12:
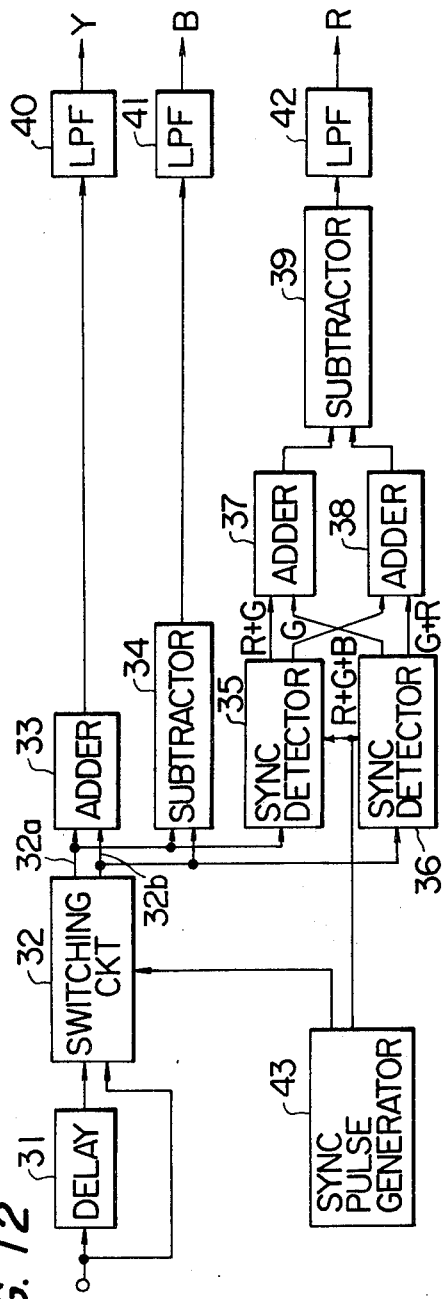
FIG. 12 is a block diagram showing an embodiment of a signal processing circuit for the solid-state color imaging device employing the mosaic color filter of FIG. 11(a).

Before describing the present invention in detail in conjunction with its embodiments, an example of a solid-state imaging device employing a prior-art mosaic color filter such as disclosed in U.S. Pat. No. 3,971,065 will be explained with reference to FIG. 1. The figure shows a plan view of the mosaic color filter in a model-like fashion. In the figure, an area R, an area G and an area B indicate an R (red) filter, a G (green) filter and a B (blue) filter respectively. All these filter elements are arrayed with a one-to-one correspondence to individual photosensors which are arrayed in the horizontal and vertical directions.

The feature of the mosaic color filter illustrated in FIG. 1 is that the G filters are placed at every second element position in both the horizontal and vertical directions and that the R filters and the B filters are placed at every second row and every second column alternately with the G filters, respectively. According to this construction, the photosensors which receive brilliance components are existent every second element positions in both the horizontal and vertical directions, so that an image sampling in which brilliance signals predominate in both the horizontal and vertical directions can be achieved.

With the solid-state imaging device employing the mosaic color filter of FIG. 1, however, the utilization factor of light is inferior because the filter elements arranged in correspondence with the respective photosensors are the R filter, the G filter and the B filter, each of which can transmit light to the corresponding photosensor by only about ⅓ of the total light component. In addition, the resolution of the device, especially the resolution in an oblique direction is low. More specifically, the brilliance component-transmitting filters which are the most contributive to the resolution, namely the G filters, are located only at every second element position in both the horizontal and vertical directions. Therefore, letting d denote the pitch of the photosensors in the horizontal or vertical direction, the G filters can exist only at a pitch of $\sqrt{2}$ d in the oblique direction. This situation is illustrated in FIG. 2. In the figure, hatched squares indicate the positions in which the G filters exist.

Hereunder, this invention will be described in detail in conjunction with its embodiments. A first group of embodiments of this invention are illustrated in FIGS. 3, 4(a) and 4(b), 5, 6 and 7(a) to 7(e). A feature of this first group of embodiments is that in considering any four adjacent photosensors in two rows and two columns, a filter corresponding to one of the photosensors is a W (panchromatic transmission) filter, a filter corresponding to the photosensor adjacent in the horizontal direction to the photosensor for which the W filter is disposed is one selected from among a R filter, a G filter and a B filter, and filters corresponding to the remaining two photosensors are two complementary-color filters differing from each other and adapted to transmit the transmission light of the selected filter.

FIG. 3 is a diagram showing an example of the first group of embodiments. In this figure, a plan view of a mosaic color filter is schematically shown as in FIG. 1. Referring to FIG. 3, an area Ye indicates a yellow transmitting filter, an area Cy a cyan transmitting filter, an area G a green transmitting filter, and an area W a panchromatic transmission filter. The respective color filter elements are arranged in correspondence with the individual photosensors. In the figure, n, n+1, m and m+1 represent the positions of the filter elements in the horizontal and vertical directions on the light receiving face of a solid-state imaging device.

Light from the image of an object is spacially sampled by the mosaic color filter, whereupon it is subjected to photoelectric conversion. Regarding signal outputs at this time, as the characteristics of the complementary color filters Ye, Cy and Mg (magenta), it holds that Ye signal=(G+R) signal, that Cy signal=(G+B) signal and that Mg signal=(R+B) signal. Therefore, for a blue light, the phases of the n-th row and the (n+1)-th row are identical and are as shown in FIG. 4(a). For a red light, however, the n-th row has a carrier wave as shown in FIG. 4(b), whereas the (n+1)-th row has the carrier wave as shown in FIG. 4(a). The green light is not sampled at all, and a base-band signal is provided.

Such multiplexed signals are divided into a base-band component and a carrier component by the use of a low-pass filter and a band-pass filter. A signal (R+2G+B) can be obtained from the output of the low-pass filter, and a signal B and a signal R can be obtained from the output of the band-pass filter by adding and subtracting between the signals of the n-th row and the (n+1)-th row. With this filter arrangement, it can be seen that the phases of the carrier waves of the n-th row and the (n+1)-th row are inverse as to the R signal, whereas the phases are identical as to the B signal. The carrier waves become equal in frequency. Further, since the R filters and the B filters are respectively arranged at every second photosensor, the carrier frequencies of the R and B signals can be made high. Further, since the band width of the (R+2G+B) signal of the base band is great, the resolution becomes high. Of course, the utilization factor of light is high owing to the use of the Cy filter, the Ye filter and the W filter. Moreover, since the G signals, which are the most important for the brilliance component, can be obtained from all the photosensors, the resolution in an oblique direction is very high.

This invention is effective for a solid-state imaging device which has a number of vertical picture elements for one frame which is great enough to completely perform interlaced scanning. For example, it is especially effective in a solid-state imaging device such as shown in FIG. 6 in which two adjacent horizontal lines are simultaneously read out from individual output lines. Referring to the figure, numeral 11 designates a horizontal scanning circuit, numeral 12 a vertical scanning circuit, numeral 13 a switching circuit for interlaced scanning, numeral 14 means for generating a control signal for interlace, for example, a flip-flop circuit, numeral 15 a horizontal read-out switch, numeral 16 an output line common to horizontal lines on one side, numeral 17 an output line common to horizontal lines on the other side, numeral 18 a vertical read-out switch, and numeral 19 a photosensor (e.g. a photodiode). In this construction, a control signal is impressed on a control terminal 14' during every field to select the two horizontal lines.

This arrangement is employed because it is advantageous in points of the after-image and the signal-to-noise ratio. Using this arrangement, signals of the output lines 16 and 17 are applied to terminals (n) and (n+1) as shown in FIG. 5. In FIG. 6, the output line 16 delivers outputs of only odd horizontal lines, while the output line 17 delivers outputs of only even horizontal lines at all times. The signals applied to the terminals are connected to low-pass filters 1 and 1' and band-pass filters 2 and 2'. Outputs from the filters 1 and 1' are added by an adder 3, to provide at a terminal 8 a signal 2 . (R+2G+B) which is a base-band signal. Outputs from the band-pass filters 2 and 2' are added by an adder 4, and the resultant signal is detected by a detector 6, to provide a B signal at an output terminal 9. The outputs of the band-pass filters 2 and 2' are coupled to a subtractor 5, whereupon the resultant signal is detected by a detector 7 to provide an R signal at an output terminal 10.

As shown in FIG. 5, the R signal is inverted between the n-th row and the (n+1)-th row, but, of course, the B signal could be inverted instead. Although the R signal and the B signal are selected as the carrier waves, it is to be understood that the R signal and the G signal or the G signal and the B signal could also be selected for the carrier. More specifically, FIG. 7(a) shows an embodiment in which the B signal is inverted between the n-th row and the (n+1)-th row. FIGS. 7(b) and 7(c) show cases where the R and G signals are selected as the carrier waves. The R signal is inverted between the n-th row and the (n+1)-th row in FIG. 7(b), and the same inversion is shown for the G signal in FIG. 7(c). In these cases, a signal (R+G+2B) is the base-band component. FIGS. 7(d) and 7(e) show cases where the G and B signals are selected as the carrier waves. The B signal is inverted between the n-th row and the (n+1)-th row in FIG. 7(d), and the same inversion is shown for the G signal in FIG. 7(e). In these cases, a signal (2R+G+B) is the base-band component. Obviously, circuit arrangements similar to that of FIG. 5 can be made for the above five modifications.

Now, a modified embodiment of the circuit arrangement of FIG. 5 will be described. In the circuit arrangement of FIG. 5, the low-pass filters 1 and 1' are respectively connected to the two input terminals, and their outputs are added by the adder 4. However, it is possible to previously execute the addition and to subsequently pass the resultant signal through a low-pass filter. In order to obtain the R signal, the signals of the output lines 16 and 17 may be subjected to a subtraction by a subtractor to thereafter detect the resultant signal by a detector. The R signal is also obtained in such a way that the signals of the output lines 16 and 17 are delayed by a time corresponding to one photosensor by means of delay elements, that the delayed signals are respectively subjected to subtractions with the undelayed signals so as to obtain a signal (B−R) and a signal (B+R), and that these signals are subjected to a subtraction, the difference of which is detected. Of course, the R signal may well be obtained in such a way that, after the respective signals Cy, Ye, W and G are sampled and held over a component of two photosensors by means of a sample and hold circuit, they are operated. As regards the B signal, the circuit arrangement of FIG. 5 may be similarly replaced with a measure wherein after adding the signals of the output lines 16 and 17 by means of an adder, the sum signal is detected through a band-pass filter. The B signal may be obtained in such a way that the signals of the output lines 16 and 17 are delayed by a time corresponding to one photosensor by means of delay elements, that the delayed signals are respectively subjected to subtractions with the undelayed signals so as to obtain a signal (B−R) and a signal (B+R), and that these signals are added so as to detect the sum signal. The B signal may well be obtained in such a way that, after sampling and holding the respective signals Cy, Ye, W and G over a component of two photosensors by means of a sample and hold circuit, they are operated.

FIG. 8 shows an embodiment in a second group of mosaic color filters according to the present invention. This second group of embodiments is made up of filters which are modifications of those in the first group of embodiments. In the case of the foregoing first group of embodiments, the predetermined filters for the four adjacent photosensors in two rows and two columns are arrayed periodically every two photosensors in the horizontal and vertical directions. On the other hand, in the second group of embodiments, the filters for any four adjacent photosensors in two rows and two columns have the structure described above and are arrayed periodically every two photosensors in the horizontal direction, but the filter elements of the m-th column and the (m+1)-th column are alternately arranged for every two photosensors in the vertical direction. More specifically, as is apparent from FIG. 8, the filters arranged in the n-th row and the (n+1)-th row are arranged in the same respective rows as in FIG. 3, whereas the filters arranged in the (n+2)-th row and the (n+3)-th row have a construction in which the filters arranged in the n-th and (n+1)-th rows respectively are alternated. Owing to this construction, in addition to the effects of the foregoing embodiments, it is possible to significantly reduce the moiré in the case of read-out by the interlaced scanning.

The (R+2G+B) signal and the R and B signals can also be provided from an imaging device which employs the mosaic filter having the structure of the embodiment of FIG. 8. This can be done with a signal processing circuit having a circuit arrangement such as shown in FIG. 9, which has a simple improvement over the circuit arrangement of FIG. 5. In FIG. 9, numerals 20 and 21 designate inverter circuits (e.g., inverting switches), while the other construction is quite the same as in FIG. 5. A signal for controlling whether or not the inversion is performed is applied to control terminals 22 and 23 of the respective inverter circuits 20 and 21 every horizontal scanning period, or every field in case of the construction of FIG. 6. This signal may be, for example, the output of the switching circuit for the interlaced scanning 13 in FIG. 6.

FIGS. 10(a) and 10(b) illustrate as odd fields and even fields picture elements at which the B signal becomes the carrier wave and the R signal becomes the carrier wave in the case of employing the mosaic color filter of FIG. 8, the solid-state imaging device of FIG. 6, and the signal processing circuit of FIG. 9. The terms "odd field" and the "even field" signify cases of simultaneously reading out one set of two horizontal lines which consists of the n-th and (n+1)-th rows and which consists of the (n+1)-th and (n+2)-th rows, respectively. FIG. 10(a) corresponds to the case of the B signal and FIG. 10(b) the R signal, with solid lines corresponding to the case of the odd field and dotted lines the even field.

It is apparent from the figures that, besides the effects of the first group of embodiments, the embodiment of FIG. 8 significantly reduces the moire in the case of executing the interlaced scanning. Obviously, other embodiments of the second group corresponding respectively to FIGS. 7(a) to 7(e) can be readily constructed.

Now, a third group of embodiments of this invention will be explained with reference to FIGS. 11(a) and 11(b), FIG. 12, FIGS. 13(a) to 13(d), FIG. 14 and FIG. 15. A feature of this group of embodiments is that when any four adjacent photosensors in two rows and two columns are considered, a filter element corresponding to one of the photosensors is a W filter, a filter element corresponding to the photosensor adjacent in the vertical direction to the photosensor for which the W filter is disposed in one sort of filter selected from among a R filter, a G filter and a B filter, and filter elements corresponding to the other two photosensors are two complementary color filters which differ from each other and whose transmission components are the transmission light of the selected filter.

FIG. 11(a) shows an embodiment of the third group of embodiments. In the case of periodically arranging the mosaic color filter in FIG. 11(a), signals (R+G) and G are obtained from the n-th row and signals (G+B) and (R+G+B) are obtained from the (n+1)-nth row in an alternate manner. Therefore, merely by adding the signals of the n-th and (n+1)-th rows and passing the resultant signal through a low-pass filter, a signal (R+2G+B) can always be obtained from every photosensor in the horizontal direction, and the video signal of high resolution can be provided.

FIG. 12 shows an embodiment of a signal processing circuit which can be used with the mosaic color filter of FIG. 11(a). Since, in the present embodiment, the horizontal lines of the n-th and (n+1)-th rows are read out in time sequence, a delay means 31 is provided for delaying the output signal of the n-th row for one horizontal scanning period (1 H) along with a signal switching circuit 32. The signal switching circuit 32 switches the signals so as to always provide the (R+G) signal and the G signal at its output terminal 32a and to always provide the (G+B) signal and the (R+G+B) signal at its output terminal 32b. Both of the output signals of the signal switching circuit 32 are added by an adder circuit 33, and the sum signal is passed through a low-pass filter 40, whereby a brilliance signal Y can be obtained. Since the brilliance signal Y becomes the (2G+R+B) signal at all times, a picture of good resolution can be reproduced. Further, the base-band signal B can be obtained by employing a subtractor circuit 34 and a low-pass filter 41. Using the signals (R+G), G, (G+B) and (R+G+B) separated by synchronous detector circuits 35 and 36, the R signal can be obtained with adder circuits 37 and 38, a subtractor circuit 39 and a low-pass filter 42. Shown at 43 is a synchronizing pulse generator circuit.

When, in the case of a filter arrangement such as shown in FIG. 11(b), the circuit of FIG. 12 is employed, the brilliance signal Y is obtained as the output of the low-pass filter 40, the base-band signal R as the output of the low-pass filter 41, and the B signal as the output of the low-pass filter 42. When the number of picture elements in the vertical direction is about 250, the delay means 31 and the signal switching circuit 32 are required. However, the delay means 31 and the signal switching circuit 32 in FIG. 12 are not necessary in a case of employing a solid-state imaging device in which the number of picture elements in the vertical direction is about 500 and the signals of two horizontal lines can be simultaneously read as in, for example, FIG. 6.

FIGS. 13(a) to 13(d) show further embodiments of the third group. In FIGS. 13(a) and 13(c), all of the four picture elements include red as their transmission component, while in FIGS. 13(b) and 13(d), they include blue as their transmission component. Whenever the signals of the n-th and (n+1)-th rows are added, a signal (2R+G+B) and a signal (R+G+2B) are obtained, respectively.

Figure 14:
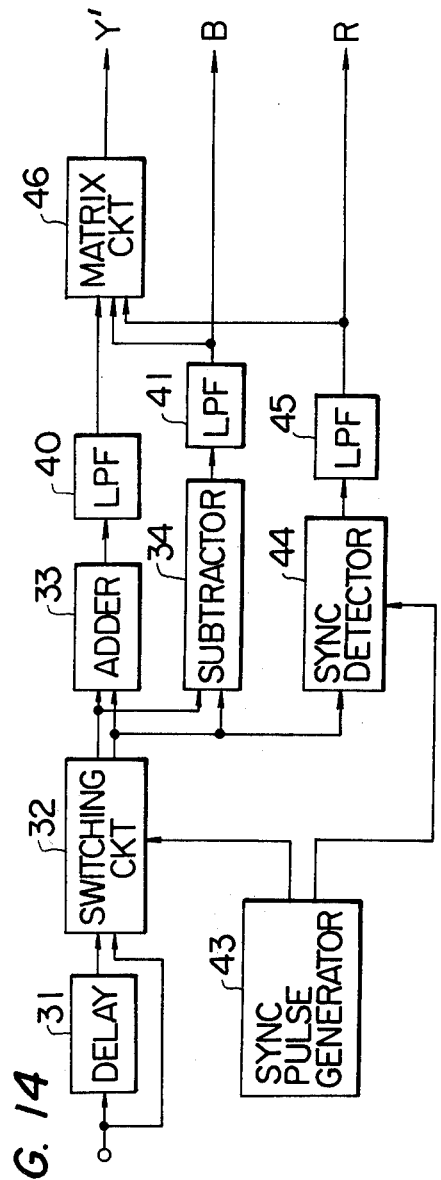
FIG. 14 is a block diagram showing an embodiment of a signal processing circuit for the solid-state color imaging device employing the mosaic color filter of FIG. 13(a).

An embodiment of a signal processing circuit for use with the embodiment of FIG. 13(a) is shown in FIG. 14. From a solidstate imaging device equipped with the mosaic color filter of FIG. 13(a), the (G+R) signal and the R signal are produced at the n-th row, and the (R+B) signal and the (R+B+G) signal at the (n+1)-th row. The (2R+G+B) signal is therefore obtained in such a way that, after separating the signals of the n-th row and the (n+1)-th row by the use of delay means 31 and a signal switching circuit 32, they are added by an adder circuit 33, the sum signal being passed through a low-pass filter 40. The base-band signal B can be obtained in such a way that the difference of the separated signals is taken by a subtractor circuit 34 and passed through a low-pass filter 41. The R signal can be obtained in such a way that the signals of the n-th row, i.e., the (G+R) signal and the R signal are synchronously detected by a synchronous detector circuit 44, whereupon the detected signal is passed through a low-pass filter 45. The output of the low-pass filter 40 may be directly used as a brilliance signal. Since, however, there is a great difference between the mixing ratio of the R, G and B signals and the brilliance signal stipulated in the NTSC color television format, a brilliance distortion develops. It is, therefore, necessary to form a brilliance signal Y′ free of such a brilliance distortion by subtracting low-frequency components of the R and B signals (below 500 KHz) with a matrix circuit 46.

The filter arrangement of FIG. 13(b) may also be used with the signal processing circuit of FIG. 14. With this arrangement, the output of the low-pass filter 40 becomes the (R+G+2B) signals, the output of the low-pass filter 41 becomes the base-band signal R, and the output of the low-pass filter 45 becomes the B signal.

Figure 15:
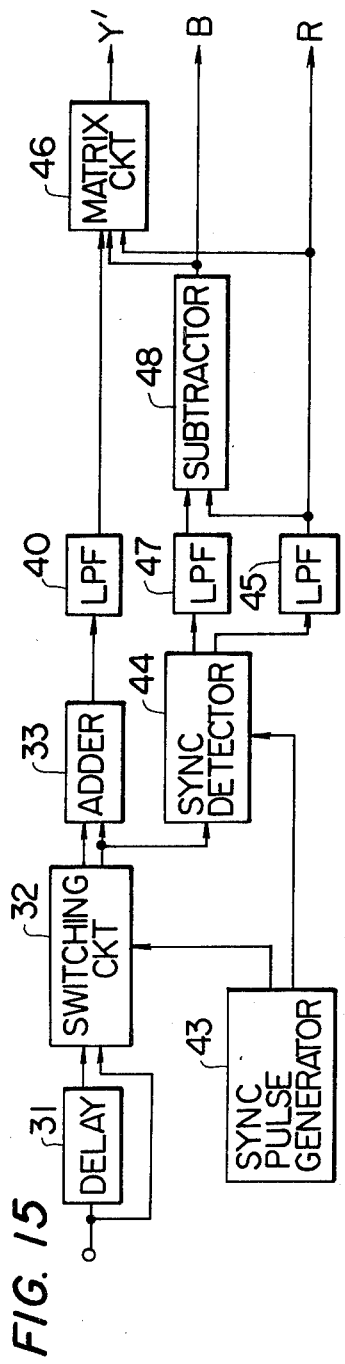
FIG. 15 is a block diagram showing an embodiment of a signal processing circuit for the solid-state color imaging device employing the mosaic color filter of FIG. 13(c).

FIG. 15 shows an embodiment of a signal processing circuit which can be used with the mosaic color filter of FIG. 13(c). In this figure, blocks having the same numerals as in FIG. 14 indicate the same parts. In the case of FIG. 13(c), the (G+R) signal and the (R+G+B) signal are obtained from the n-th row, and the (R+B) signal and the R signal from the (n+1)-th row. Therefore, the (2R+G+B) signal is obtained as the output of the low-pass filter 40. The (R+B) signal and the R signal are always introduced into the synchronous detector circuit 44 by the signal switching circuit 32 so as to separate the (R+B) signal and the R signal. The R signal is obtained through the low-pass filter 45. The (R+B) signal is obtained through a low-pass filter 47, and the B signal is obtained by performing a subtraction in a subtractor circuit 48. Also in this case, when the (2R+G+B) signal is employed as a brilliance signal, a brilliance distortion appears similar to that discussed above in regard to FIG. 14. Therefore, a signal free of the brilliance distortion can be reproduced by subtracting the low-frequency components of the R and B signals (below 500 KHz) with the matrix circuit 46.

The signal processing circuit of FIG. 15 may also be used with the filter arrangement of FIG. 13(d). With such an arrangement, the output of the low-pass filter 40 becomes the (R+G+2B) signal, the output of the low-pass filter 45 becomes the B signal, and the output of the subtractor circuit 48 becomes the R signal. The signals of the n-th row, i.e., the (R+B) signal and the B signal are introduced into the synchronous detector circuit 44.

A modified embodiment of the signal processing circuit shown in FIG. 12 will now be explained. For the separation of the R signal, there is a method wherein the respective outputs 32a and 32b in FIG. 12 are passed through band-pass filters and are thereafter detected and added, and a method wherein the outputs 32a and 32b are subjected to a subtraction, the difference of which is detected, etc. Similarly, various modifications could also be provided for the separator circuit for the B signal.

FIGS. 16, 17(a) to 17(d), 18 and 19(a) to 19(e) show a fourth group of embodiments of this invention. This forth group of embodiments may be deemed modifications of the embodiments of the third group. As a feature of the fourth group of embodiments, filters in any adjoining four columns and two rows (four filters in the horizontal direction) in a mosaic color filter disposed at the front face of photosensors have the following construction. The W filter is employed as a first filter; one of the R filter, the G filter and the B filter is employed as a second filter; those two filters among the three sorts of complementary color filters of the Ye filter, the Cy filter and the Mg filter which transmit the transmission light of the second filter are used as third and fourth filters; every two of the first, second, third and fourth filters are included for the photosensors in the adjacent two rows and four columns; and such two filters are arranged at positions which shift by two photosensors in the horizontal direction and by one photosensor in the vertical direction. In other words, in the case of the third group of embodiments, the predetermined filters for the adjacent four photosensors in two rows and two columns are periodically arrayed every two photosensors in each of the horizontal and vertical directions, whereas in the case of the fourth group of embodiments, the filters for the adjacent four photosensors in any two rows and two columns have the structure of the third group of embodiments and are periodically arrayed every two photosensors in the vertical direction, but the mosaic filters of the n-th row and the (n+1)-th row are replaced every two photosensors in the horizontal direction.

FIG. 16 shows a first one of the fourth group of embodiments. The signal output of the n-th row of FIG. 16 has a carrier wave as shown in FIG. 17(a) for the red light and a carrier wave as shown in FIG. 17(b) for the blue light, and it executes no sampling and becomes a base-band signal for the green light. That is, the carrier waves of the red light and the blue light have equal frequencies and shift in phase by 90°. The signal output of the (n+1)-th row is similar, but it becomes the carrier waves shown in FIGS. 17(c) and 17(d) for the red light and the blue light respectively, the state being such that the phases of the respective outputs of the n-th row are inverted.

Accordingly, by introducing the signal output of the solid-state imaging device into a low-pass filter and a band-pass filter, the (R+2G+B) signal is obtained from the output of the low pass filter, and the carrier waves of the R and B signals are obtained from the output of the band-pass filter. By synchronously detecting the carrier waves, the R and B signals can be obtained. Since, with this filter arrangement, the phases of the carrier waves of the R and B signals are inverted in the respective rows, there is the advantage that the baseband signal is not mixed into the carrier waves of the R and B signals. Further, the sum of the signals of the n-th and (n+1)-th rows is the (R+2G+B) signal at all times. Therefore, when it is used for brilliance, a brilliance signal is taken from each photosensor, resulting in a good resolution.

Figure 18:
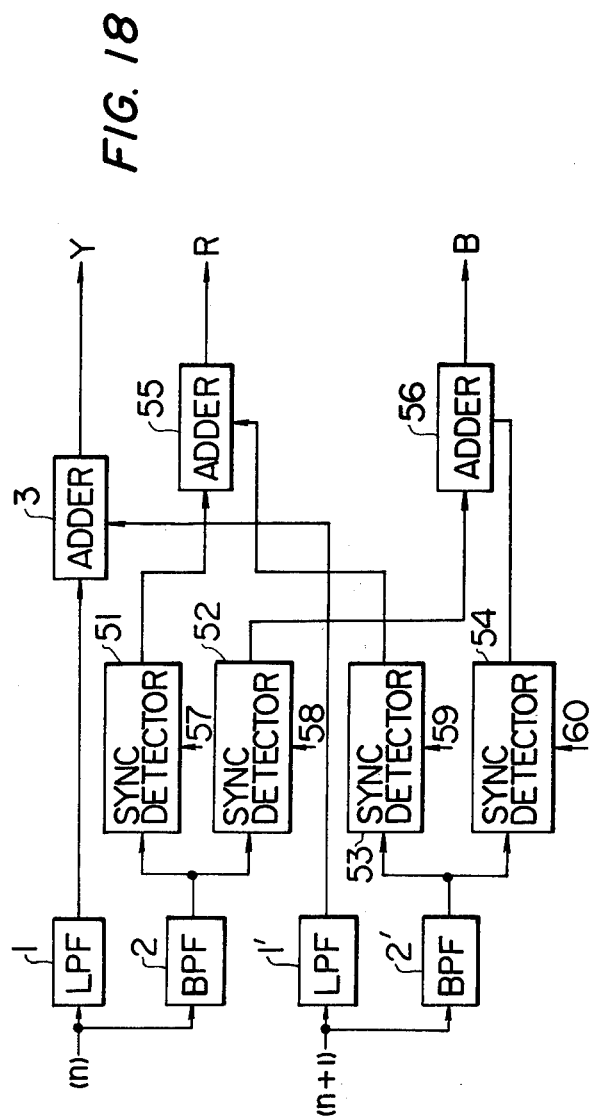
FIG. 18 is a block diagram showing an embodiment of a signal processing circuit for the solid-state color imaging device employing the mosaic color filter of FIG. 16.

An example of a signal processing circuit for use with the fourth group of embodiments is shown in FIG. 18. This illustrates an embodiment in the case where, for example, the mosaic color filter of FIG. 16 is arranged in the solid-state imaging device shown in FIG. 6. The signal outputs of the n-th and (n+1)-th rows are connected to low-pass filters 1 and 1' and band-pass filters 2 and 2'. Outputs from the low-pass filters 1 and 1' are added by an adder 3, to provide the base-band output signal (R+2G+B). Outputs from the band-pass filters 2 and 2' are detected by synchronous detectors 51 to 54 which are respectively driven by reference signal waves 57 to 60 having phases of from 0 (zero) to 3/2 π. Outputs from the synchronous detectors 51 and 53 and outputs from the synchronous detectors 52 and 54 are respectively added by an adder 55 and an adder 56, to provide the R signal and the B signal. The (R+2G+B) signal, the R signal and the B signal can be put into a color video signal.

As another embodiment, it is possible to first subject the signal outputs of the band-pass filters 2 and 2' to a subtraction and to obtain multiplexed signals of the R and B signals by means of only two synchronous detectors.

FIGS. 19(a) to 19(e) show other constructions of the mosaic color filters of the fourth group of embodiments. In FIG. 19(a), the R and B signals, are used as carrier waves as in FIG. 16. Both FIGS. 19(b) and 19(c) show embodiments wherein the R and G signals are carrier waves, while the (R+G+2B) signal is a base-band signal. Both FIGS. 19(d) and 19(e) show embodiments wherein the G and B signals are carrier waves, while the (2R+G+B) signal is a base-band signal. Of course, the signal processing circuit of FIG. 18 is also effective for these embodiments.

Figure 20:
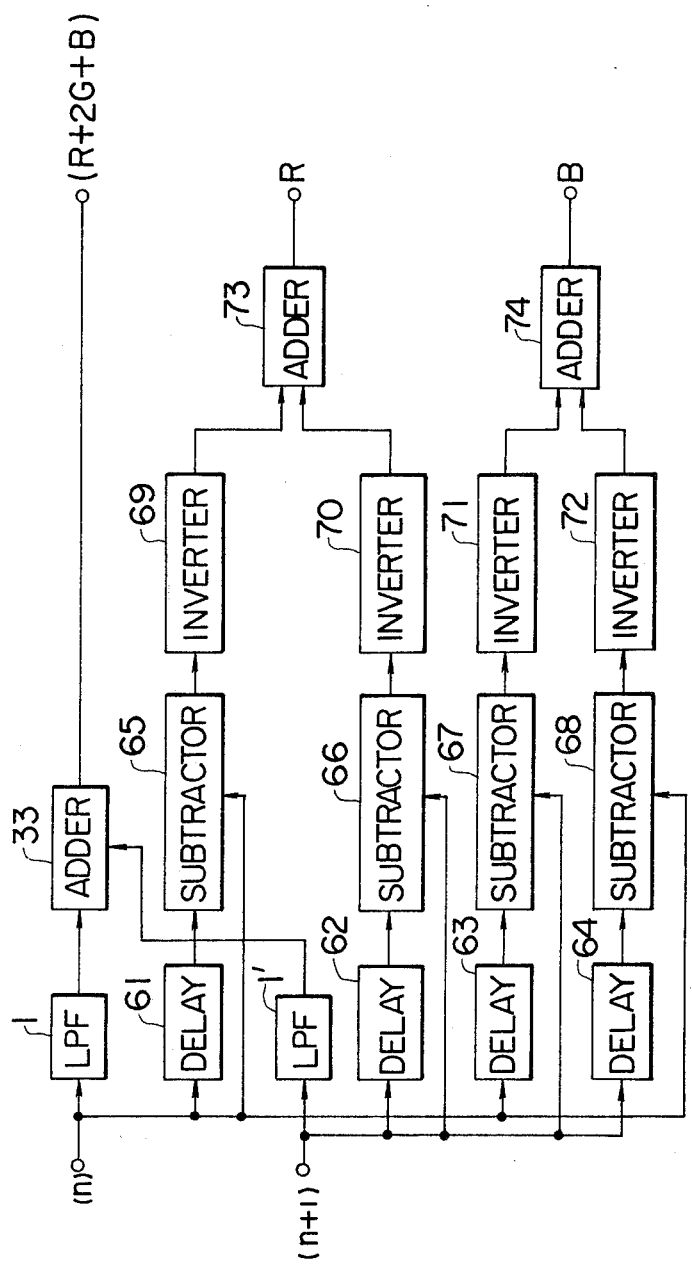
FIG. 20 is a block diagram showing another embodiment of a signal processing circuit for the solid-state imaging device employing the mosaic color filter of this invention.

In cases of the filter arrangements of the third and fourth groups, other embodiments of the signal processing circuits may be used. An embodiment in the case of the filter arrangement in FIG. 11(a), for example, will be explained with reference to FIG. 20. As described previously, the (R+2G+B) signal is obtained in any column merely by adding the signals of the n-th row and the (n+1)-th row. On the other hand, when the signals of the adjoining photosensors in the same rows are subjected to subtractions, (Ye−G)=R and (Cy−W)=−R, and when the signals of the photo-sensors in the diagonal directions are subjected to subtractions, (Ye−W)=−B and (Cy−G)=B. The present embodiment shown by FIG. 20 exploits this fact. Referring to FIG. 20, the signals having passed through low-pass filters 1 and 1' are added by an adder circuit 33 and become the (R+2G+B) signal. Numerals 61 to 64 designate delay circuits for a component corresponding to one photosensor. In the n-th and (n+1)-th rows, the signals delayed by the component corresponding to one photosensor and the undelayed signals are respectively subjected to subtractions by subtractors 65 and 66 so as to provide the R and −R signals. After unifying the polarities of these signals with polarity inverter circuits 69 and 70, the resultant signals are added by an adder circuit 73 to obtain the R signal. Likewise, the signals of the photosensors in the diagonal positions are subjected to subtractions by means of subtractors 67 and 68, the difference signals have the polarities unified by polarity inverter circuits 71 and 72, and the resultant signals are added by an adder circuit 74, to obtain the B signal. When the filters for the four photosensors in FIG. 11 (a) and FIG. 11(b) are periodically arrayed alternately in the horizontal direction, the above circuit can be used. Further, a reduction of the moire is achieved. Although the case of FIG. 11(a) has been exemplified in the above explanation, it is, of course, understood that the present signal processor circuit can also be used for the embodiment of FIG. 11(b) and the embodiments of the fourth group.

As modifications of the fourth group, the following are considered. Letting F denote the filter arrangement indicated by the third group, $\bar{F}$ denote an arrangement in which the columns of the filter elements of the filter arrangement F are replaced with each other, and $|F$ denote an arrangement in which the rows thereof are replaced with each other, the filter arrangement of the fourth group is represented as $F \cdot |F$. As a modification of this arrangement, the following arrangements can also attain a high resolution:

$$F \cdot \bar{F}, \quad |F \cdot \bar{F}, \quad \frac{F}{\bar{F}}, \quad \frac{F}{|F}, \quad \text{and} \quad \frac{|F}{\bar{F}}$$

Similarly, the following arrangements in which F, $\bar{F}$ and $|F$ are arbitrarily selected and caused to adjoin can achieve high resolutions:

$$\frac{F \cdot \bar{F}}{\bar{F} \cdot F}, \quad \frac{F \cdot \bar{F}}{|F \cdot F}, \quad \frac{\bar{F} \cdot |F}{|F \cdot \bar{F}}, \quad \frac{F \cdot |F}{|F \cdot F}, \quad \text{and} \quad \frac{|F \cdot F}{\bar{F} \cdot |F}$$

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. A solid-state color imaging device comprising:
    a single image sensor including a plurality of photosensors which are arrayed in horizontal and vertical directions;
    means for reading out optical signals of said photosensors sequentially in the horizontal direction;
    a mosaic color filter which is made up of filter elements arranged in correspondence with the respective photosensors; and
    a signal processing circuit which provides a color signal on the basis of the optical signals delivered by said read-out means;
    wherein any group of four adjacent filter elements in two rows and two columns comprises a first filter which is made of a panchromatic transmission filter, a second filter which is selected from the group consisting of a first spectral region-transmitting filter, a second spectral region-transmitting filter and a third spectral region-transmitting filter having transmission characteristics different from one another, and third and fourth filters which are made of complementary color filters which transmit a transmission component of said second filter and having transmission components different from each other, and said signal processing means is supplied with all optical signals necessary to produce said color signal from said signal image sensor through said read-out means.

2. A solid-state color imaging device according to claim 1, wherein said second filter is a green transmitting filter, and said third and fourth filters are a cyanic color transmitting filter and a yellow transmitting filter respectively.

3. A solid-state color imaging device according to claim 1 or 2, wherein said first filter and said second filter are adjacent in the horizontal direction.

4. A solid-state color imaging device including a plurality of photosensors which are arrayed in horizontal and vertical directions, and a mosaic color filter which is made up of a plurality of filter elements arranged in horizontal and vertical directions in correspondence with the respective photosensors,
    a solid-state color imaging device wherein any group of four adjacent filter elements comprises a first filter which is made of a panchromatic transmission filter, a second filter which is selected from the group consisting of a first spectral region-transmitting filter, a second spectral region-transmitting filter and a third spectral region-transmitting filter having transmission characteristics different from one another, and third and fourth filters which are made of complementary color filters which transmit a transmission component of said second filter and having transmission components different from each other, wherein said first filter and said second filter are adjacent in the horizontal direction and further wherein a plurality of said four filter groups are arranged in the mosaic color filter such that for each horizontally adjacent pair of four filter groups the positions of said first and second filters of one group are interchanged with respect to the positions of said first and second filters of the other group which horizontally adjoins said one group, and the positions of said third and fourth filters of said one group are interchanged with respect to the positions of said third and fourth filters of said other group.

5. A solid-state color imaging device according to claim 1 or 2, wherein said first filter and said second filter are adjacent in the vertical direction.

6. A solid-state color imaging device including a plurality of photosensors which are arrayed in horizontal and vertical directions, and a mosaic color filter which is made up of a plurality of filter elements arranged in horizontal and vertical directions in correspondence with the respective photosensors, a solid-state color imaging device wherein any group of four adjacent filter elements comprises a first filter which is made of a panchromatic transmission filter, a second filter which is selected from the group consisting of a first spectral region-transmitting filter, a second spectral region-transmitting filter and a third spectral region-transmitting filter having transmission characteristics different from one another, and third and fourth filters which are made of complementary color filters which transmit a transmission component of said second filter and having transmission components different from each other, wherein said first filter and said second filter are adjacent in the vertical direction and further wherein a plurality of said four filter groups are arranged in the mosaic color filter such that for each horizontally adjacent pair of four filter groups the positions of said first and second filters of one group are interchanged with respect to the positions of said first and second filters of the other group which horizontally adjoins said one group, and the positions of said third and fourth filters of said one group are interchanged with respect to the positions of said third and fourth filters of said other group.

7. A solid-state color imaging device comprising:
a single image sensor including a plurality of photosensors which are arrayed in horizontal and vertical directions;
means for simultaneously reading out optical signals of two vertically adjacent ones of said photosensors in the horizontal direction to provide two output signals;
a mosaic color filter which is made up of filter elements arranged in correspondence with the respective photosensors; and
a signal processing circuit which provides a color signal on the basis of the two outputs of the read-out means;
wherein any group of four adjacent filter elements in two rows and two columns comprises a first filter made of a panchromatic transmission filter, a second filter made of a green transmitting filter, a third filter made of a cyanic color transmitting filter, and a fourth filter made of a yellow transmitting filter, and said signal processing means is supplied with all optical signals necessary to produce said color signal from said single image sensor through said read-out means.

8. A solid-state color imaging device according to claim 7, wherein said first filter and said second filter adjoin each other in the vertical direction, and said signal processing circuit includes means for adding said two outputs of said read-out means.

9. A solid-state color imaging device comprising:
a single image sensor including a plurality of photosensors which are arrayed in horizontal rows and vertical columns;
means for simultaneously reading out optical signals of two vertically adjacent ones of said photosensors located in adjacent horizontal rows to provide first and second output signals each corresponding to a respective horizontal row;
a mosaic color filter which is made up of filter elements arranged in correspondence with the respective photosensors; and
a signal processing circuit which provides a color signal on the basis of the two outputs of the read-out means;
wherein any group of four adjacent filter elements in two rows and two columns comprises a first filter which is made of a panchromatic transmission filter, a second filter which is selected from the group consisting of a first spectral region-transmitting filter, a second spectral region-transmitting filter and a third spectral region-transmitting filter having transmission characteristics different from one another, and third and fourth filters which are made of complementary color filters which transmit a transmission component of said second filter and having transmission components different from each other, and
said signal processing means is supplied with all optical signals necessary to produce said color signal from said single image sensor through said read-out means.

10. A solid-state color imaging device according to claim 9, wherein said signal processing means includes means for adding said two outputs of said read-out means and means for subtracting said two outputs of said read-out means.

11. A solid-state color imaging device comprising
a plurality of photosensors which are arrayed in horizontal rows and vertical columns;
means for simultaneously reading out optical signals of two vertically adjacent ones of said photosensors located in adjacent horizontal rows to provide first and second output signals each corresponding to a respective horizontal row;
a mosaic color filter which is made up of filter elements arranged in correspondence with the respective photosensors; and
a signal processing circuit which provides a color signal on the basis of the two outputs of the read-out means;
wherein any group of four adjacent filter elements comprises a first filter which is made of a panchromatic transmission filter, a second filter which is selected from the group consisting of a first spectral region-transmitting filter, a second spectral region-transmitting filter and a third spectral region-transmitting filter having transmission characteristics different from one another, and third and fourth filters which are made of complementary color filters which transmit a transmission component of said second filter and having transmission components different from each other, wherein said signal processing circuit includes a first low pass filter and a first band pass filter coupled to the first output signal and a second low pass filter and a second band pass filter coupled to the second output signal.

12. A solid-state color imaging device according to claim 11, further comprising a first adder coupled to the outputs of said first and second low pass filters, a second adder coupled to the outputs of said first and second band pass filters, and a subtractor coupled to the outputs of said first and second band pass filters.

13. A solid-state color filter according to claim 12, wherein said first and second filters are adjacent in a horizontal row.

14. A solid-state color imaging device according to claim 12, further comprising a first inverter coupled between the first band pass filter and the second adder, and a second inverter coupled between the first band pass filter and the subtractor.

15. A solid-state color imaging device according to claim 14, wherein the first and second filters are adjacent in a horizontal row.

16. A solid-state color imaging device according to claim 15, wherein a plurality of said four filter groups are arranged in the mosaic color filter such that for each vertically adjacent pair of four filter groups the positions of said first and second filters of one group are interchanged with respect to the positions of said first and second filters of the other group which vertically adjoins said one group, and the positions of said third and fourth filters of said one group are interchanged with respect to the positions of said third and fourth filters of said other group.

* * * * *